US009356730B2

(12) United States Patent
Cheng et al.

(10) Patent No.: US 9,356,730 B2
(45) Date of Patent: May 31, 2016

(54) METHOD FOR ADDING ERROR PROTECTION BITS TO MATCH CODEWORD LENGTH

(75) Inventors: Jung-Fu Cheng, Fremont, NC (US); Yi-Pin Eric Wang, Fremont, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1961 days.

(21) Appl. No.: 12/524,801

(22) PCT Filed: Jan. 29, 2008

(86) PCT No.: PCT/SE2008/050113
§ 371 (c)(1),
(2), (4) Date: Sep. 4, 2009

(87) PCT Pub. No.: WO2008/094121
PCT Pub. Date: Aug. 7, 2008

(65) Prior Publication Data
US 2010/0023845 A1      Jan. 28, 2010

Related U.S. Application Data

(60) Provisional application No. 60/887,217, filed on Jan. 30, 2007.

(51) Int. Cl.
| | | |
|---|---|---|
| *H04L 1/00* | (2006.01) | |
| *H03M 13/09* | (2006.01) | |
| *H03M 13/11* | (2006.01) | |

(52) U.S. Cl.
CPC ........... *H04L 1/0011* (2013.01); *H03M 13/095* (2013.01); *H03M 13/11* (2013.01); *H04L 1/003* (2013.01); *H04L 1/0083* (2013.01); *H04L 1/0084* (2013.01)

(58) Field of Classification Search
CPC ... H04L 1/0011; H04L 1/0083; H04L 1/0084; H04L 1/003
USPC .................................. 714/776, 774, 755, 779
See application file for complete search history.

(56) References Cited

U.S. PATENT DOCUMENTS 4,047,151 A * 9/1977 Rydbeck et al. ............... 714/774
4,779,276 A * 10/1988 Kashida et al. ............... 714/776
(Continued)

OTHER PUBLICATIONS

Xuemin Chen; Reed, I.S.; Truong, T.K.; , "A performance comparison of the binary quadratic residue codes with the 1/2-rate convolutional codes," Information Theory, IEEE Transactions on , vol. 40, No. 1, pp. 126-136, Jan. 1994.*

(Continued)

*Primary Examiner* — Joseph D Torres
(74) *Attorney, Agent, or Firm* — Coats & Bennett, PLLC (57) ABSTRACT

Teachings presented herein provide a method and apparatus for processing input information bits for coding using a code, such that the length of the information word formed from the input information bits matches a fixed information word length defined by the code. In at least one embodiment, a coding circuit receives input information bits (and adds error protection bits as needed, to make the information word length match the fixed information word length. The method and apparatus contemplate generating the error protection bits by sub-coding a subset of the input information bits (e.g., parity bit generation), thereby providing extra protection for that subset. These teachings allow the same code to be used for coding feedback or other information, where the amount of information to be coded varies as a function of operating modes.

22 Claims, 4 Drawing Sheets

(56) References Cited

U.S. PATENT DOCUMENTS

| | | | |
|---|---|---|---|
| 4,980,897 A * | 12/1990 | Decker et al. | 375/265 |
| 5,056,112 A * | 10/1991 | Wei | 375/280 |
| 5,828,677 A * | 10/1998 | Sayeed et al. | 714/774 |
| 5,841,793 A * | 11/1998 | Fukuda | 714/752 |
| 5,844,918 A * | 12/1998 | Kato | 714/751 |
| 6,007,238 A * | 12/1999 | Okanoue et al. | 714/774 |
| 6,079,041 A * | 6/2000 | Kunisa et al. | 714/752 |
| 6,223,324 B1 * | 4/2001 | Sinha et al. | 714/776 |
| 6,289,485 B1 * | 9/2001 | Shiomoto | 714/779 |
| 6,490,243 B1 * | 12/2002 | Tanaka et al. | 370/216 |
| 6,622,278 B1 * | 9/2003 | Morgan et al. | 714/758 |
| 6,865,699 B2 * | 3/2005 | Tanaka et al. | 714/701 |
| 6,895,544 B1 * | 5/2005 | Park et al. | 714/776 |
| 7,020,824 B2 * | 3/2006 | Tanaka et al. | 714/755 |
| 7,028,241 B1 * | 4/2006 | Blair et al. | 714/752 |
| 7,155,657 B2 * | 12/2006 | Bordes et al. | 714/774 |
| 7,155,658 B2 * | 12/2006 | Huffman et al. | 714/776 |
| 7,162,682 B2 * | 1/2007 | Lewis | 714/776 |
| 7,319,718 B2 * | 1/2008 | Roh et al. | 375/224 |
| 7,734,987 B2 * | 6/2010 | Kaburaki et al. | 714/774 |
| 7,793,193 B2 * | 9/2010 | Koch et al. | 714/776 |
| 2002/0124224 A1 | 9/2002 | Blankenship et al. | |

OTHER PUBLICATIONS

3rd Generation Partnership Project. "FEC Coding of Type-B CQI/PCI Information." 3GPP TSG RAN WG1 Meeting #47bis, R1-070493, Sorrento, Italy, Jan. 15-19, 2007.

3RD Generation Partnership Project. "HS-DPCCH in Support of D-TxAA." 3GPP TSG RAN WG1 #46, R1-062031, Tallin, Estonia, Aug. 28-Sep. 1, 2006.

* cited by examiner

METHOD FOR ADDING ERROR PROTECTION BITS TO MATCH CODEWORD LENGTH

TECHNICAL FIELD

The present invention generally relates to signal coding, and particularly relates to error protection sub-coding to adapt different information word lengths to the information word length defined by a desired code.

BACKGROUND

Information coding, such as done to increase transmission robustness over wireless communication links, is commonplace. For example, U.S. App. No. 2002/0124224 A1 discloses the use of symbol repetition, where reception of the repeated symbols is improved by using maximal ratio combining of the repeated symbols. The '224 application further teaches that the number of symbols that are repeated can be adjusted to match the frame length of an encoder and/or a channel interleaver. As another example, the published international patent application WO 2006/011699 A1 discloses the use of bit repetition to increase robustness. The '699 publication particularly teaches a form of unequal error protection where the repetition count for particular bits in a set of bits to be transmitted is set according to their importance. For example, the MSB in binary word used to report signal quality is repeated more than the LSB in that word, given its relatively greater importance in terms of binary weight.

Other examples exist in, various wireless communication standards, for coding feedback information transmitted by a given first transceiver to a given second transceiver, for use by the second transceiver in adjusting one or more aspects of its transmissions to the first transceiver. As a particular example, Release 7 of the Wideband Code Division Multiple Access (WCDMA) standards define feedback information in support of MIMO operation to include channel quality indicators (CQIs), which may comprise CQI bits indicating channel quality at the receiver.

More particularly, for "Type-A" operations, Release 7 defines coded feedback based on the use of a "20, 10" code, where ten information bits represent an information word to be coded into a code word that is twenty bits long. Here, Type-A denotes the Multiple-Input-Multiple-Output (MIMO) operating mode, and particularly connotes a "2×2" case, where two information streams are concurrently transmitted from two antennas according to defined pre-coding weights. A corresponding MIMO transceiver provides feedback comprising eight CQI bits and two "PCI" bits, which comprise preceding indicator bits. This combination produces ten information bits, which matche the chosen "20, 10" code.

Problematically, however, the amount of CQI information is reduced for "Type-B" MIMO operations, which involve the transmission of one rather than two information streams. Correspondingly, the number of information bits, including CQI and PCI bits, needed to be fed back in each reporting period during Type-B operation is less than ten. Thus, a shortfall exists between the number of information bits to be encoded and the information word length requirements of the chosen code. More details for these various MIMO-related feedback operations are given in "FEC Coding of type-B CQI/PCI Information", as presented by INTERDIGITAL at the 3GPP TSG RAN WG1 Meeting #47, on 15-16 Jan. 2007, in Sorrento, Italy (identified as Contribution R1-070493); further, one may refer to Contribution R1-070529, as presented by QUALCOMM in the same meeting. This latter presentation was entitled "Coding of HS-DPCCH to support operation of FDD MIMO".

Such information bit shortfalls may arise in other coding applications as well, with similar challenges arising if it is desired to use the same code where the number of information bits input for coding is subject to variation.

SUMMARY

Teachings presented herein provide a method and apparatus for advantageously processing input information bits for coding using a code, such that the length of the information word formed from the input information bits matches the fixed information word length defined by the code. In at least one embodiment, a coding circuit is configured to receive input information bits and add error protection bits as needed, to make the length of the information word match the fixed information word length. The method and apparatus contemplate generating the needed error protection bits by sub-coding a subset of the input information bits, such as in parity bit generation, thereby providing extra protection for that subset of input information bits. As an example context, practicing these teachings in a wireless communication transceiver allows the same code to be used for coding feedback or other information, where the amount of information to be coded varies as a function of operating modes.

In one embodiment, a coding circuit forms information words from one or more types of information bits input to the coding circuit. To form a given information word for coding, the coding circuit receives a number of input information bits, of one or more types. If the number of input information bits matches the fixed information word length defined by the code to be used for information word coding, the coding circuit forms the information word from the input information bits. However, if the number of input information bits is less than the fixed information word length, the coding circuit adds error protection bits. These error protection bits are treated as information bits, wherein the coding circuit forms the information word for coding from the input information bits and the added error protection bits.

In one or more embodiments, the coding circuit generates the error protection bits by sub-coding a subset of the input information bits. For example, the error protection bits may be generated as parity bits for a prioritized subset of the input information bits. In one or more embodiments, the coding circuit in one operating mode receives input information bits in numbers matching the defined information word length, and it thus does not need to add additional error protection bits and simply forms information words for coding using the input information bits. However, in another operating mode the coding circuit receives input information bits in numbers fewer than the defined information word length. In this mode, for each received set or batch of input information bits to be formed into an information word for coding, the coding circuit generates the number of error protection bits needed to make the overall number of bits (input information bits plus error protection bits) match the defined information word length.

In any case, the added error protection bits contemplated herein provide the dual function of serving as additional information bits so that the input information bits and the error protection bits together are the right number for forming an information word of the correct length for coding, and serving as additional protection for the subset of input information bits for which they were generated. That is, decoding of a code word 18 produced by this process can be configured to exploit knowledge of code 20 and, for additional error protection of the subset of information bits to be decoded from the code word 18, the process can be configured to exploit knowledge of the sub-coding used to generate the error protection bits.

Of course, those skilled in the art will appreciate that the present invention is not limited by the foregoing brief summary of features and advantages. Indeed, those skilled in the art will recognize additional features and advantages upon reading the following detailed description, and upon viewing the accompanying drawings.

DETAILED DESCRIPTION

Figure 1:
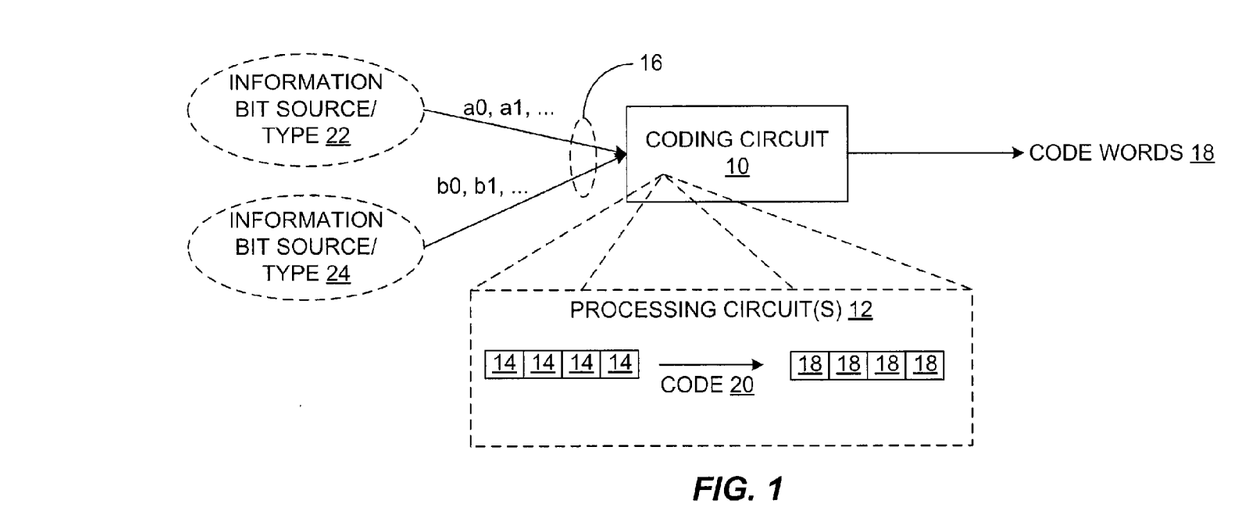
FIG. 1 is a block diagram of one embodiment of a coding circuit configured according to the teachings presented herein.

As a non-limiting example, FIG. 1 illustrates a coding circuit 10 comprising one or more processing circuits 12 configured to form information words 14 from sets or batches of input information bits 16, and to code the information words 14 into code words 18 using a code 20. The code 20 is defined with a fixed information word length. Broadly, the coding circuit 10 is configured to use the same code 20 to encode information words 14, in cases where the number of input information bits 16 to be formed into an information word 14 for coding matches the fixed information word length, and in cases where the number of input information bits 16 is less than the fixed information word length. In the latter case, for given input information bits 16, the coding circuit 10 extends the starting information word length by adding error protection bits for a prioritized subset of information bits 16.

Such processing provides "extra" error protection for the prioritized subset of information bits 16 within the information word 14, and such processing thus may be considered as providing unequal error protection for a designated portion of the information word 14 that is considered in some respect to be more important than the remaining portion of the information word 14. Thus, in one aspect, the coding circuit 10 adds unequal error protection to one or more of the input information bits 16, or at least does so in cases where the number of input information bits 16 for forming the information word 14 is less than the fixed information word length of the code 20. Such circumstances may arise, for example, in the context of feeding back information from one wireless transceiver to another, where the amount and/or type of information fed back varies.

Figure 2:
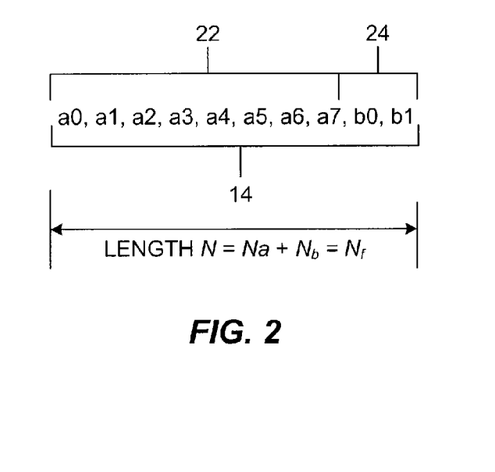
FIGS. 2 and 3 are diagrams of example information word lengths for coding according to the teachings presented herein.

FIG. 1 also illustrates that the input information bits 16 may be of one or more different types, e.g., the input information bits 16 may be a mix of bits from type/source 22 and type/source 24. Thus, FIG. 2 illustrates a case where the information words 14 each comprise some number of input information bits 16 of type 22 (denoted as a0, a1, ... ) and some number of input information bits 16 of type 24 (denoted as b0, b1, ... ). More particularly, FIG. 2 illustrates the case where the starting length N of the information words 14 equals the fixed information word length $N_f$ defined for the code 20—i.e., the combined number of input information bits 16 of type 22 ($N_a$) and input information bits 16 of type 24 ($N_b$) equals the fixed information length $N_f$ defined for the code 20. In such cases, the coding circuit 10 does not carry out the above-described extending of information word length.

Figure 3:
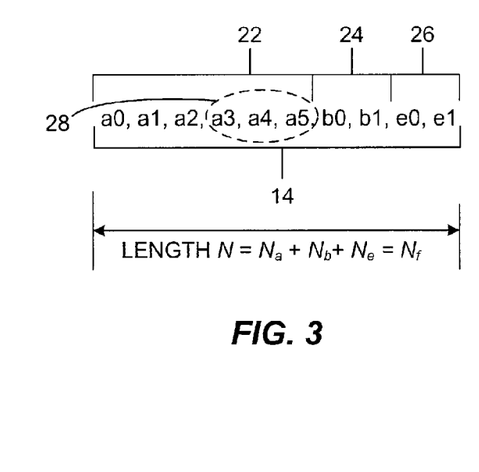

However, FIG. 3 illustrates a case where $N_a+N_b<N_f$. Here, the "basic" or "starting" information word length N represented by the number of input information bits 16 is less than $N_f$. Correspondingly, the coding circuit 10 extends the starting input information word length by adding error protection bits 26. The number ($N_e$) of error protection bits 26 added is the number needed to make $N_a+N_b+N_e=N_f$. That is, the coding circuit 10 adds error protection bits 26, so that the length of the information word 14 formed from the input information bits 16 and the error protection bits 26 matches the fixed information word length of the code 20. (From the perspective of coding the information word 14 via code 20, all bits in the information word 14 are information bits, regardless of whether they are originally input information bits 16 or added error protection bits 26. Of course, decoding may include additional decoding processes to take advantage of the additional error protection afforded by the error protection bits 26.)

As shown in FIG. 3, a portion of the information word 14 may be designated as prioritized. More particularly, FIG. 3 illustrates that one or more of the input information bits 16 comprising the information word 14 may be designated as a prioritized subset 28 of input information bits 16 within the information word 14. Preferably, the error protection bits 26 are added for this prioritized subset 28 of input information bits 16. For example, as will be detailed later herein, the error protection bits 26 may be generated as parity bits for the prioritized subset 28 of input information bits 16. FIG. 3 further illustrates that the prioritized subset 28 of input information bits 16 may comprise all or a subset of one type of input information bits 16, which is useful in cases where one type of input information bits 16 within the information word 14 are of higher priority than the other types. In such cases, the error protection bits 26 may be generated by sub-coding some or all of the higher priority input information bits 16.

With the above examples in mind, then, the coding circuit 10 is characterized in one or more embodiments by its one or more processing circuits 12 being configured to form information words 14 of a required information word length in cases where the number of input information bits 16 matches that required word length, and in cases where the number of input information bits 16 is less than the required word length. Where the number of input information bits 16 received for formation of a given information word 14 is less than the fixed information word length defined by the code 20, the coding circuit 10 adds error protection bits 26 as needed, to make the length of the information word formed from the input information bits 16 and the added error protection bits 26 match the fixed information word length. As noted, the added error protection bits 26 protect a prioritized subset 28 of the input information bits 16, and may be generated as parity bits for that prioritized subset 28.

Figure 4:
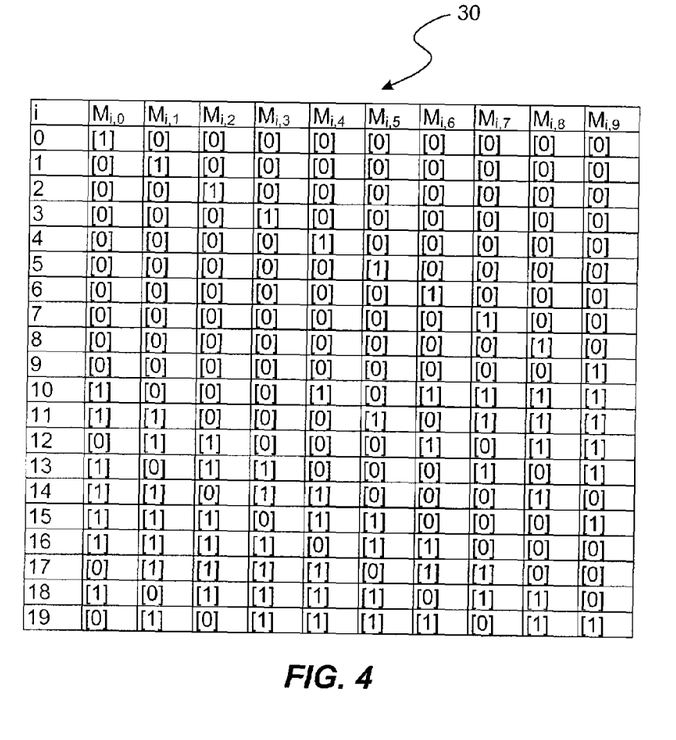
FIG. 4 is a table containing the generator matrix corresponding to a punctured quadratic residual code, which may be used for coding as taught herein.

In one or more embodiments, the code 20 comprises a systematic code, wherein the information bits used to form a given information word 14 appear in the corresponding code word 18. In at least one such embodiment, the code 20 is a punctured quadratic residual code, which is a type of systematic code. FIG. 4 illustrates a non-limiting example generator matrix 30 that is generated from a punctured quadratic residual code contemplated herein. Note that variations of the generator matrix 30 may be obtained by permuting columns or rows. The encoding process of code 20 can be described by $$b_i = \sum_{n=0}^{9} (a_n \times M_{i,n}) \bmod 2, \quad \text{Eq. (1)}$$

For purposes of Eq. (1), $(a_0, a_2, \ldots, a_9)$ denote the information bits used to form the information word 14, regardless of their type, and regardless of whether they are all input information bits 16, or a mix of input information bits 16 and added error protection bits 26. Further, for purposes of Eq. (1), $(b_0, b_1, \ldots, b_{19})$ denote the code bits in the code word 18 generated from the information word 14. The values of $M_{i,n}$ are, for example, given in the table of FIG. 4.

Regardless of the particular implementation of code 20, the coding circuit 10 is configured to add error protection bits 26 for information word formation in cases where the number of input information bits 16 provided for coding result in an information word length N that is less than the fixed information word length $N_f$ as defined for the code 20. As explained, the coding circuit 10 extends the information word length by adding error protection bits 26 as "additional" input information bits 16. In at least one embodiment, the coding circuit 10 is configured to generate the error protection bits 26 by subcoding a prioritized subset 28 of the input information bits 16 originally input to the coding circuit 10. Thus, for coding via code 20, the originally input information bits 16 and the added error protection bits 26 are all treated as being information bits within the information word 14 to be coded.

Figure 5:
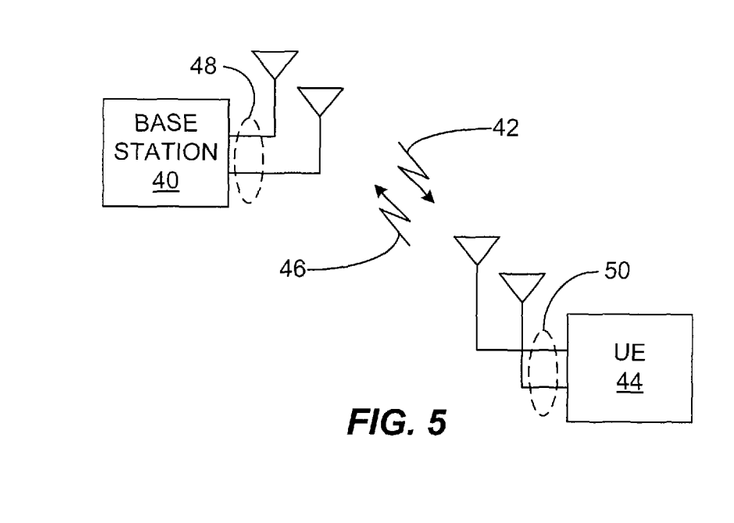
FIG. 5 is a block diagram of one embodiment of a wireless communication network base station and a corresponding wireless communication device, either or both of which may be configured to perform coding as taught herein.

Turning to FIG. 5, one sees a non-limiting operational example involving a wireless communication network base station 40 (e.g., a NodeB in a WCDMA network) that transmits one or more downlink signals 42 to wireless communication device (cellular radiotelephone, PDA, pager, network interface card, etc.), which is generically identified a "user equipment" (UE) 44. In turn, the UE 44 transmits one or more uplink signals 46 to the base station 40. In at least one such embodiment, the base station 40 includes two or more antennas 48 and the UE 44 includes two or more antennas 50 and the pair (40, 44) are configured to operate as first and second MIMO transceivers, according to one or more defined MIMO operating modes (which can be defined by the number of information streams concurrently transmitted by the base station 40 from its antennas 48 according to a set of antenna pre-coding weights, for example).

As a non-limiting example, the base station 40, in a first MIMO operating mode, sends Type-A transmissions from its antennas 48, involving a "2×2" transmission of two information streams from two antennas, as defined by Release 7 of the WCDMA standards. In a second MIMO operating mode, the base station 40 sends Type-B transmissions involving a single information stream.

In both Type-A and Type-B transmission cases, the UE 44 provides feedback information, e.g., via uplink signals 46, to the base station 40. However, the kind and/or amount of feedback information varies between the two cases. Advantageously, then, an embodiment of the coding circuit 10 can be implemented in the UE 44. (In general, embodiments of the coding circuit 10 can be implemented at either or both the base station 40 and the UE 44. Further, complementary decoding circuits can be implemented at either or both the base station 40 and UE 44.)

Figure 6:
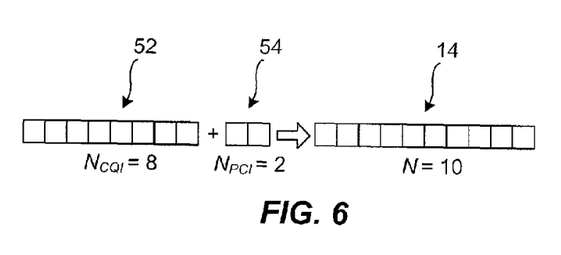
FIGS. 6 and 7 are diagrams of example mixes of different types of information bits and different starting information word lengths for coding according to the teachings presented herein.

As an example of the possible implications of the above changing MIMO modes, FIG. 6 illustrates the formation of information words 14 for feedback from the UE 44 to the base station 40 in support of Type-A transmissions from the base station 40 to the UE 44. One sees that in this mode of operation, the coding circuit 10 receives eight channel quality indicator (CQI) bits 52 and two pre-coding indicator (PCI) bits 54 for forming into an information word 14 to be coded. Therefore, the coding circuit 10 can form information words 14 of length 10 directly from the received input information bits 16. That is, N=10 based on the input information bits 16 and, assuming that $N_f$=10 for code 20, one sees that information word length extending need not be performed by the UE's coding circuit 10.

Figure 7:
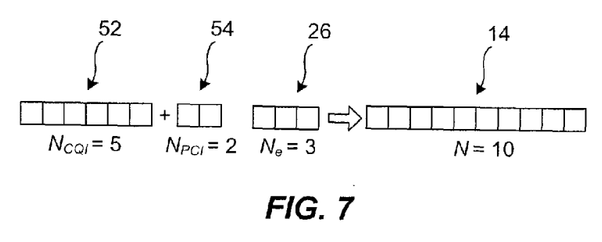

However, FIG. 7 illustrates the formation of information words 14 for feedback from the UE 44 to the base station 40 in support of Type-B transmissions from the base station 40 to the UE 44. One sees that in this mode of operation, the coding circuit 10 receives only five channel quality indicator (CQI) bits 52 and two pre-coding indicator (PCI) bits 54 for each information word 14 to be formed and coded. Forming information words 14 from these reduced-count sets of input information bits 16 would therefore result in an information word length of seven, which is not appropriate for coding via code 20. That is, N=7 based solely on the input information bits 16 and, assuming that $N_f$=10 for code 20, one sees that information word length extending must be performed by the UE's coding circuit 10 if the same code 20 is to be used for coding feedback in this operating mode.

To that end, the UE's coding circuit 10 computes error protection bits 26 and extends the information word length N of each information word 14 formed in the mode to the required ten bits. More particularly, in the illustrated example, the coding circuit 10 would generate three error protection bits 26, to be included in the information word 14 as additional input information bits 16, such that $N_{CQI}+N_{PCI}+N_e=N_f$. Of course, $N_f$ may be a value other than ten, and the numbers and types of input information bits 16 input to the coding circuit 10 may be different than that illustrated, meaning that a greater or lesser number of error protection bits 26 would need to be generated for extending word length N to the desired value $N_f$.

With the above context in mind, it may be helpful to illustrate one non-limiting example of error protection bit generation contemplated herein. Let $PCI_0$ and $PCI_1$ denote the two PCI bits 54 and $CQI_0, CQI_1, \ldots CQI_4$ denote the five CQI bits 52, where $CQI_0$ is the LSB and $CQI_4$ is the MSB. An improved Type-B feedback information coding method contemplated herein uses the following coded bits:

$$b_i = \sum_{n=0}^{9} (a_n \times M_{i,n}) \bmod 2, \quad \text{Eq. (2)}$$

where

-continued $$a_0 = PCI_0$$
$$a_1 = PCI_1$$
$$a_2 = CQI_4$$
$$a_3 = CQI_0$$
$$a_4 = CQI_3$$
$$a_5 = CQI_2 + CQI_4$$
$$a_6 = CQI_3 + CQI_4$$
$$a_7 = CQI_2 + CQI_3$$
$$a_8 = CQI_1$$
$$a_9 = CQI_2$$

Eq. (3)

As with Eq. (1), "a" generically denotes information word bits and "b" generically denotes code word bits, and the use of "a" and "b" in this context is not to be confused with the use of "a" and "b" in FIGS. 1-3 to distinguish between different types of input information bits 16 that might be input to the coding circuit 10 for information word formation.

This embodiment of the proposed method forms an information word 14 whose length N matches the fixed information word length $N_f$, based on forming the information word 14 to include five CQI bits 52, two PCI bits 54, and three error protection bits 26. Doing so allows a "20, 10" code (20 coded bits formed from ten information bits) to be used, even though only seven input information bits 16 (i.e., CQI bits 52 and PCI bits 54) are provided to the coding circuit 10 for information word formation. Thus, in at least one embodiment, the code 20 used by the coding circuit 10 is a "20, 10" code having an output code word length of twenty bits and a fixed input information word length of ten bits. In such contexts, the coding circuit 10 forms information words 14 of the required length by adding error protection bits 26 as needed.

The inventors have observed that the simulated performance of such subset coding for Type-B information based on the same encoding sequences used for Type-A information approaches the performance of optimized non-subset coding designs. That is, the methods taught herein allow the convenience of using the same "20, 10" code 20 for Type-A MIMO operations and for Type-B MIMO operations, while approaching the performance that would be obtained by using different codes, each optimized for a respective one of Type-A and Type-B operations.

Figure 8:
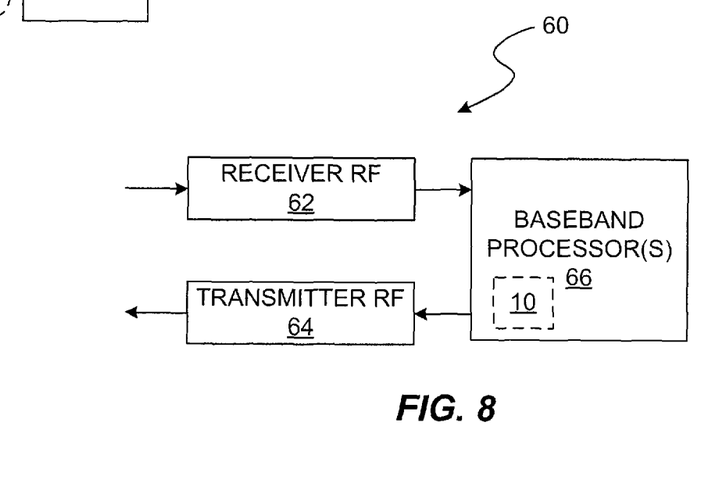
FIG. 8 is a block diagram of one embodiment of a MIMO transceiver configured to carry out coding as taught herein.

Thus, in one or more embodiments, the coding circuit 10 is configured for use in a Wideband Code Division Multiple Access (WCDMA) transceiver, such as the transceiver 60 illustrated in FIG. 8. The illustrated transceiver 60, which is shown in simplified form, includes radiofrequency receiver circuits 62 for filtering, downconverting and digitizing antenna-received signals, radiofrequency transmitter circuits 64 for generating amplified, modulated radiofrequency carrier signals for antenna transmission, and one or more supporting baseband processing circuits 66. The baseband processing circuit(s) 66 comprise hardware-based circuits, software-based circuits, or any mix thereof. In at least one embodiment, the coding circuit 10 is functionally implemented within the baseband processing circuits 66 via hardware, software, or any combination thereof.

Various embodiments of the transceiver 60 may be implemented in base stations and/or mobile stations, for use in wireless communication networks. In particular, the illustrated transceiver 60 includes an embodiment of the coding circuit 10, and is further characterized in that the first and second modes of operation of the coding circuit 10 comprise first and second modes of MIMO operation for the transceiver 60. The modes are distinguished in that the information words 14 in the first mode of operation include a first number of channel quality information bits 52 and in the second mode of operation include a reduced, second number of channel quality information bits 52.

Operation of the coding circuit 10 of FIG. 8 is further characterized in that the coding circuit 10 forms information words 14 (for MIMO transmission feedback) in both the first and second modes of operation to each include a set of channel quality information bits 52 and a set of antenna pre-coding information bits 54, wherein the channel quality information bits 52 are prioritized over the antenna pre-coding information bits 54. Here, extending information word length in the second mode of operation comprises adding error protection bits 26 to each information word 14 to provide extra protection for all or a subset of the channel quality information bits 52 in the information word 14.

It should be understood that the coding circuit 10 in one or more embodiments forms information words 14 from one or more types 22, 24 of input information bits 16, and it should be understood that operations of the coding circuit 10 may change with changing operating modes. For example, in a first mode of operation, the coding circuit 10 does not generate/add error protection bits 26. This mode of operation applies, for example, where the number of input information bits 16 input to the coding circuit 10 for information word formation matches the fixed information word length ($N_f$). For example, for each information word 14 to be formed, the coding circuit may receive some number $N_a$ of input information bits 16 of a first type 22 and some number $N_b$ of input information bits 16 of a second type 24, where $N_a+N_b=N_f$, such that no bits need be added to have a full-length information word 14 ($N=N_a+N_b=N_f$).

In a second mode of operation, the coding circuit 10 receives a number of input information bits 16 for each information word 14 to be formed that is less than that needed to form information words 14 of the required length. In other words, the number of input information bits 16 input provided to the coding circuit 10 for information word formation does not provide for the formation of a full-length information word 14 (e.g., $N_a+N_b<N_f$). In this case, the coding circuit 10 adds one or more error protection bits 26, for the dual-benefit of providing additional error protection for a prioritized subset 28 of input information bits 16 within the information word 14 being formed and making the length N of the information word 14 match the required length $N_f$. In such cases, the number $N_e$ of information bits added is the number needed to make N equal $N_f$.

Of course, those skilled in the art will appreciate that implementation of the coding circuit 10 within a digital processing system or other computing platform is subject to variation according to the design and implementation needs and/or limitations. Broadly, it should be understood that the teachings herein present a method of forming information words 14 of a required length in cases where the number of input information bits 16 provided for information word formation is at least sometimes less than the length required by the chosen code.

Figure 9:
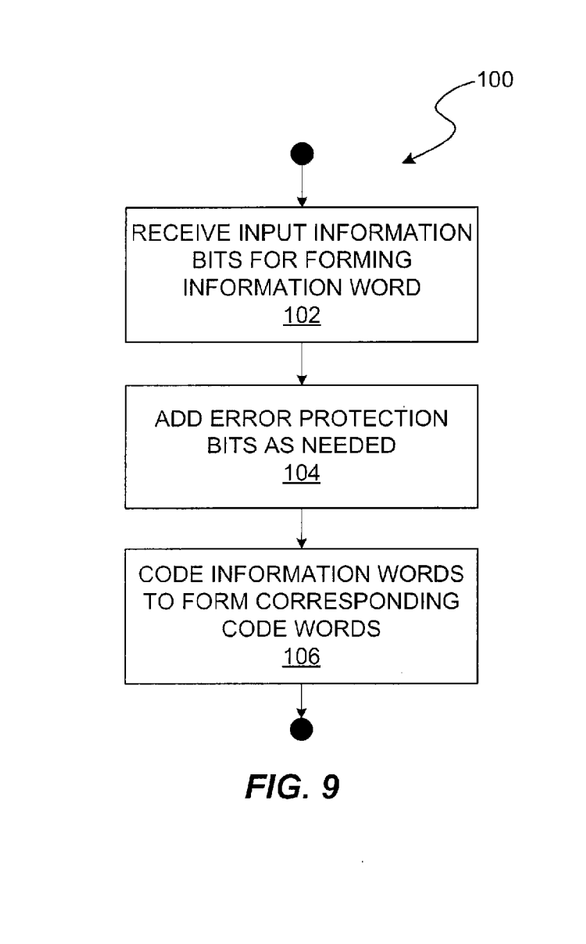
FIGS. 9 and 10 are logic flow diagrams of different embodiments of a method of coding as taught herein.

FIG. 9 illustrates one embodiment of a coding method 100 as taught herein, which may be implemented in hardware and/or software. The illustrated processing relates to forming a given information word 14. Processing includes receiving a number of input information bits 16 (Block 102). Processing further includes adding error protection bits 26 as needed to match the fixed information word length $N_f$ of the code 20 (Block 104). In particular, this operation is done by adding error protection bits 26 for a prioritized subset 28 of input information bits 16 in the given information word 14. Processing continues with coding the resulting information word 14 using the code 20 to form a corresponding code word 18 (Block 106).

As noted before, the code 20 is a systematic code in one or more embodiments, and particularly may be a punctured quadratic residual code. Also, as noted, the error protection bits 26 are in one or more embodiments generated as parity bits for the prioritized subset 28 of input information bits 16. Generally, the error protection bits 26 are generated by sub-coding the prioritized subset 28 of input information bits 16, for subsequent further coding as part of the given information word 14.

Figure 10:
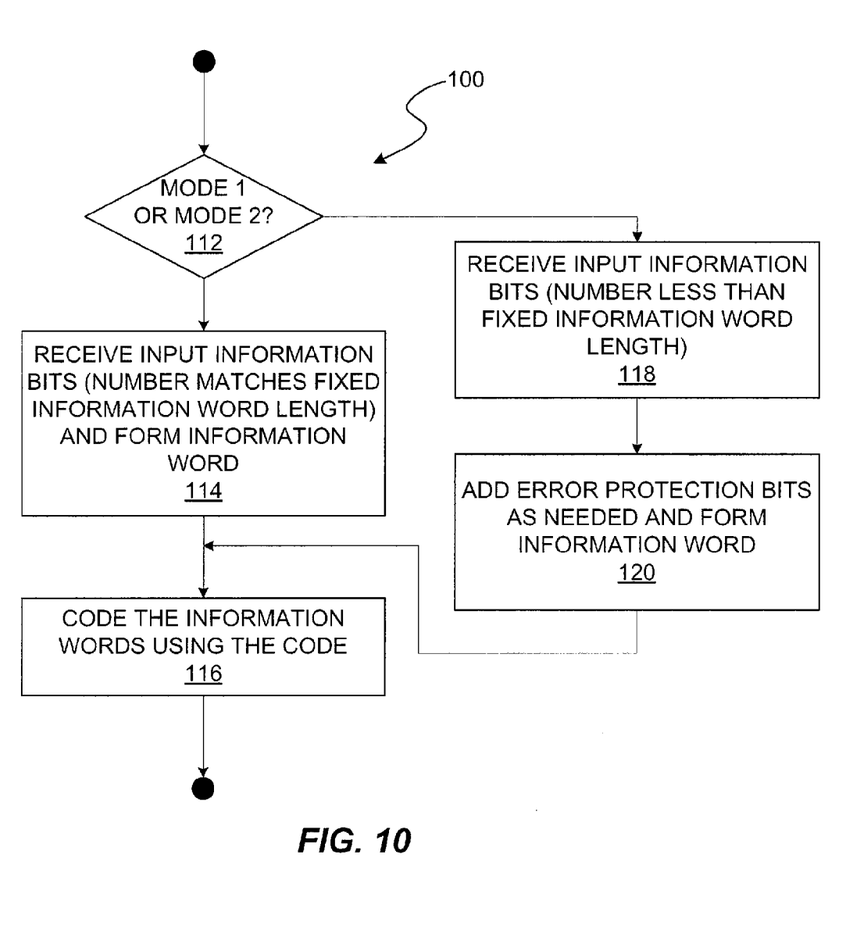

FIG. 10 illustrates another embodiment of the coding method 100, wherein processing includes determining whether a first or second mode of operation applies (Block 112) (e.g., determining whether "MODE1" or "MODE 2" is active). This may comprise simply identifying or "remembering" which MIMO mode a transceiver is operating in.

In any case, the illustrated processing is characterized in that in MODE1 the number of input information bits 16 received for forming an information word 14 matches the fixed information word length of the code 20. Thus, processing includes forming the information word 14 from the input information bits 16 without adding error protection bits (Block 114) and coding the information word 14 to produce a corresponding code word 18 (Block 116).

Further, for MODE2 operations, the method includes receiving a number of input information bits 16 for forming an information word 14, where that number is less than the fixed information word length (Block 118). In this mode, processing includes adding error protection bits 26 for a prioritized subset 28 of the input information bits 16, to obtain the correct information word length (Block 120). Processing continues from there as it does in the other mode, including coding the information word 14 to produce a corresponding code word 18. Note that the illustrated process can be repeated or looped as need, to produce a stream of code words 18 from multiple batches of input information bits 16. Also note that the mode decision need not be made each time that an information word 14 is to be coded. For example, the coding circuit 10 may operate indefinitely in one mode or another, based on the operations of controlling or supervising elements within a given transceiver.

Further, FIGS. 9 and 10 in general represent non-limiting processing examples, and the coding method taught herein is not limited to the particulars of these illustrations. Indeed, the present invention is not limited by the foregoing description and accompanying drawings. Instead, the present invention is limited only by the following claims and their legal equivalents.

What is claimed is:

1. A method of coding information using a code having a fixed information word length, the method comprising:
   receiving a number of input information bits less than the fixed information word length for forming an information word, the received input information bits being of one or more types;
   adding error protection bits to the received input information bits to make an information word length of the information word match the fixed information word length of the code, said error protection bits generated for a prioritized subset of the received input information bits by sub-coding the prioritized subset, for subsequent further coding as part of the information word; and
   coding the information word using the code to form a corresponding code word.

2. The method of claim 1, wherein the code is a systematic code.

3. The method of claim 2, wherein the systematic code is a punctured quadratic residual code.

4. The method of claim 1, further comprising generating the error protection bits as parity bits for the prioritized subset of input information bits.

5. The method of claim 1, wherein said receiving, adding, and coding are performed in a second mode of operation, and wherein in a first mode of operation the method further comprises receiving a number of input information bits equal to the fixed information word length for forming a different information word, refraining from adding error protection bits to those received input information bits for making an information word length of the different information word match the fixed information word length of the code, and coding the different information word using the code to form a corresponding code word.

6. The method of claim 5, wherein the first and second modes of operation comprise first and second modes of Multiple-Input-Multiple-Output (MIMO) operation in a Wideband Code Division Multiple Access (WCDMA) transceiver, and wherein the input information bits in the first mode of operation include a first number of channel quality information bits and in the second mode of operation include a reduced, second number of channel quality information bits.

7. The method of claim 6, wherein the input information bits in both the first and second modes of operation include a set of channel quality information bits and a set of antenna pre-coding information bits, wherein the channel quality information bits are prioritized over the antenna pre-coding information bits, and wherein said adding in the second mode of operation comprises adding error protection bits for all or a subset of the channel quality information bits.

8. The method of claim 1, wherein the input information bits comprise two or more types of information bits, with one type being prioritized over the other type or types.

9. The method of claim 8, wherein adding error protection bits comprises sub-coding all or a selected subset of the prioritized type of input information bits to produce the number of error protection bits needed to extend the information word length to match the fixed information word length.

10. The method of claim 8, further comprising generating the error protection bits as a function of all or a subset of the prioritized type of input information bits.

11. The method of claim 1, wherein the code comprises a "20 , 10" code having a code word length of twenty bits and a fixed information word length of ten bits, and wherein receiving input information bits for forming an information word comprises, in a first mode of operation, receiving ten information bits, thereby matching the fixed information word length, and, in a second mode of operation, receiving less than ten input information bits and adding error protection bits as additional information bits to thereby obtain ten information bits to form the information word for coding via the "20, 10" code.

12. A coding circuit for coding information using a code having a fixed information word length, the coding circuit comprising one or more processing circuits configured to:
   receive a number of input information bits less than the fixed information word length for forming an information word, the received input information bits being of one or more types;
   add error protection bits to the received input information bits to make an information word length of the information word match the fixed information word length of the code, said error protection bits generated for a prioritized subset of the received input information bits by sub-coding the prioritized subset, for subsequent further coding as part of the information word; and code the information word using the code to form a corresponding code word.

13. The coding circuit of claim 12, wherein the code is a systematic code.

14. The coding circuit of claim 13, wherein the code is a punctured quadratic residual code.

15. The coding circuit of claim 12, wherein the coding circuit is configured to generate the error protection bits as parity bits for the prioritized subset of input information bits.

16. The coding circuit of claim 12, wherein the coding circuit is configured to perform said receiving, adding, and coding in a second mode of operation, and is configured, in a first mode of operation, to receive a number of input information bits equal to the fixed information word length for forming a different information word, refrain from adding error protection bits to those received input information bits for making an information word length of the different information word match the fixed information word length of the code, and code the different information word using the code to form a corresponding code word.

17. The coding circuit of claim 16, wherein the coding circuit is configured for use in a Wideband Code Division Multiple Access (WCDMA) transceiver and the first and second modes of operation of the coding circuit comprise first and second modes of Multiple-Input-Multiple-Output (MIMO) operation, and wherein the number of input information bits received by the coding circuit include a first number of channel quality information bits in the first mode of operation and include a reduced, second number of channel quality information bits in the second mode of operation.

18. The coding circuit of claim 17, wherein the coding circuit is configured to receive input information bits in both the first and second modes of operation that include a set of channel quality information bits and a set of antenna pre-coding information bits, wherein the channel quality information bits are prioritized over the antenna pre-coding information bits, and wherein said adding in the second mode of operation comprises adding error protection bits for all or a subset of the channel quality information bits in the input information bits.

19. The coding circuit of claim 12, wherein the coding circuit is configured to receive input information bits including two or more types of input information bits, with one type being prioritized over the other type or types.

20. The coding circuit of claim 19, wherein the coding circuit is configured to add error protection bits by sub-coding all or a selected subset of the prioritized type of input information bits to produce the number of error protection bits needed to make the information word length of the information word match the fixed information word length.

21. The coding circuit of claim 19, wherein the coding circuit is configured to generate the error protection bits as a function of all or a subset of the prioritized type of input information bits.

22. The coding circuit of claim 12, wherein the code used by the coding circuit comprises a "20, 10" code having a code word length of twenty bits and a fixed information word length of ten bits, and wherein the coding circuit is configured to receive ten input information bits in a first mode of operation and therefore does not add error protection bits to form the information word, and in a second mode of operation to receive less than ten input information bits and therefore adds error protection bits to thereby obtain ten information bits for forming the information word for coding via the "20, 10" code.

\* \* \* \* \*